US012674009B2

(12) United States Patent
Harada et al.

(10) Patent No.: US 12,674,009 B2
(45) Date of Patent: Jul. 7, 2026

(54) HOLLOW RESIN PARTICLES USED IN RESIN COMPOSITION FOR SEMICONDUCTOR MEMBER

(71) Applicant: SEKISUI KASEI CO., LTD., Osaka (JP)

(72) Inventors: Ryosuke Harada, Osaka (JP); Koichiro Okamoto, Osaka (JP)

(73) Assignee: SEKISUI KASEI CO., LTD., Osaka (JP)

( * ) Notice: Subject to any disclaimer, the term of this patent is extended or adjusted under 35 U.S.C. 154(b) by 534 days.

(21) Appl. No.: 18/267,633

(22) PCT Filed: Dec. 3, 2021

(86) PCT No.: PCT/JP2021/044458
§ 371 (c)(1),
(2) Date: Jun. 15, 2023

(87) PCT Pub. No.: WO2022/131022
PCT Pub. Date: Jun. 23, 2022

(65) Prior Publication Data

US 2024/0059810 A1 Feb. 22, 2024

(30) Foreign Application Priority Data

Dec. 17, 2020 (JP) ................................ 2020-209334

(51) Int. Cl.
*C08J 9/32* (2006.01)
*C08F 30/02* (2006.01)
(Continued)

(52) U.S. Cl.
CPC ............ *C08F 30/02* (2013.01); *C08F 212/02* (2013.01); *C08J 9/32* (2013.01); *H10W 70/69* (2026.01); *C08L 79/08* (2013.01)

(58) Field of Classification Search
CPC ...... C08F 30/02; C08F 212/02; C08F 212/36; C08F 220/14; C08F 212/08; C08F 230/02;
(Continued)

(56) References Cited

U.S. PATENT DOCUMENTS

2016/0375657 A1 12/2016 Park et al.
2017/0121484 A1 5/2017 Sakimura et al.
(Continued)

FOREIGN PATENT DOCUMENTS

JP 2-113984 4/1990
JP 2000-311518 11/2000
(Continued)

OTHER PUBLICATIONS

Extended European Search Report issued Oct. 21, 2024 in corresponding European Patent Application No. 21906385.6.
(Continued)

*Primary Examiner* — K. Boyle
(74) *Attorney, Agent, or Firm* — Wenderoth, Lind & Ponack, L.L.P.

(57) ABSTRACT

There is provided hollow resin particles used in a resin composition for semiconductor members, which can be used in a resin composition for semiconductor members to provide a semiconductor member capable of exerting excellent low dielectric properties. The hollow resin particles used in a resin composition for semiconductor members according to an embodiment of the present invention are hollow resin particles having a hole part inside the particle, wherein a decreasing rate of a relative dielectric constant Dk1 of a film (F1) formulated with 80 parts by weight of polyimide and 20 parts by weight of the hollow resin particles to a relative dielectric constant Dk0 of a film (F0) formed with only the polyimide is 3% or more.

10 Claims, 2 Drawing Sheets

(51) Int. Cl.

| | |
|---|---|
| ***C08F 212/02*** | (2006.01) |
| ***C08L 79/08*** | (2006.01) |
| ***H10W 70/69*** | (2026.01) |

(58) Field of Classification Search

CPC ...... C08F 2/18; C08F 220/12; C08F 222/102; C08F 222/103; C08F 212/12; C08J 9/32; H10W 70/69; C08L 79/08; B01J 13/185; H01L 23/293; H01L 23/00

See application file for complete search history.

(56) References Cited

U.S. PATENT DOCUMENTS

| | | | | |
|---|---|---|---|---|
| 2018/0208733 | A1* | 7/2018 | Tayagaki | ............. A43B 13/026 |
| 2022/0041775 | A1 | 2/2022 | Harada | |

FOREIGN PATENT DOCUMENTS

| | | |
|---|---|---|
| JP | 2001-294815 | 10/2001 |
| JP | 2017-082152 | 5/2017 |
| JP | 2017-525585 | 9/2017 |
| WO | 98/50945 | 11/1998 |
| WO | 2004/067638 | 8/2004 |
| WO | 2020/054816 | 3/2020 |

OTHER PUBLICATIONS

International Search Report issued Jan. 25, 2022 in International (PCT) Application No. PCT/JP2021/044458.

* cited by examiner

HOLLOW RESIN PARTICLES USED IN RESIN COMPOSITION FOR SEMICONDUCTOR MEMBER

TECHNICAL FIELD

The present invention relates to hollow resin particles used in a resin composition for semiconductor members.

BACKGROUND ART

In recent years, increases of information processing volumes and communication rates of various electronic devices have been associated with rapid development of mounting technologies, such as increasing the integration of a semiconductor device to be mounted, the density of wiring, and the number of layers. An insulating resin material used in a semiconductor member used in semiconductor devices is required to be low in the relative dielectric constant and dielectric loss tangent of insulating resin, in order to raise the transmission rate of a high frequency signal and reduce a loss during transmission of a signal.

Such requirement is accommodated by a reported technology in which hollow particles including a shell part and a hollow portion surrounded by the shell part are mixed with insulating resin, so that an air space is introduced in the insulating resin to lower the relative dielectricity and the dielectric loss tangent.

A reported example of such a technology is a technology regarding hollow porous resin particles including a mesoporous structure and an outer wall formed on the surface of the mesoporous structure (Patent Literature 1). The hollow porous resin particles are obtained by allowing an oil-soluble polymerization initiator and a water-soluble polymerization initiator to simultaneously act during suspension polymerization of a polymerizable monomer in an aqueous system.

However, the hollow porous resin particles prepared by the method described in Patent Literature 1 have an extremely thin and brittle surface layer part. Therefore, the particles are highly likely to be broken in response to the application of an external force.

In this manner, known hollow porous resin particles are not sufficient in mechanical strength and likely to be deformed and broken when an external force is applied, and it is difficult to maintain the shape in circumstances in which an external force is applied. Such hollow porous resin particles having insufficient mechanical strength have a problem in that when used in a resin composition used in a semiconductor member such as a semiconductor package or a semiconductor module, the particles are broken by an external force during the production of the semiconductor member and a semiconductor device including the semiconductor member, and the relative dielectricity and the dielectric loss tangent cannot be lowered.

CITATION LIST

Patent Literature

Patent Literature 1: Japanese Unexamined Patent Application, First Publication No. 2017-82152

SUMMARY OF INVENTION

Technical Problem

An object of the present invention is to provide hollow resin particles used in a resin composition for semiconductor members, which can be used in a resin composition for semiconductor members to provide a semiconductor member capable of exerting excellent low dielectric properties.

Solution to Problem

Hollow resin particles used in a resin composition for semiconductor members according to an embodiment of the present invention are hollow resin particles having a hole part inside the particle, wherein a decreasing rate of a relative dielectric constant Dk1 of a film (F1) formulated with 80 parts by weight of polyimide and 20 parts by weight of the hollow resin particles to a relative dielectric constant Dk0 of a film (F0) formed with only the polyimide is 3% or more.

In one embodiment, a decreasing rate of a dielectric loss tangent Df1 of the film (F1) to a dielectric loss tangent Df0 of the film (F0) is 3% or more.

In one embodiment, the hollow resin particles have a volume average particle diameter of 0.5 μm to 100 μm.

In one embodiment, the hollow resin particles include a polymer (P) that contains at least one selected from the group consisting of a vinyl-based monomer-derived structural unit (I) and a phosphoric acid ester-based monomer-derived structural unit (II).

In one embodiment, the phosphoric acid ester-based monomer-derived structural unit (II) has an ethylene-based unsaturated group.

In one embodiment, the phosphoric acid ester-based monomer is represented by formula (1).

$$[R^1{-}O{-}(R^2{-}O)_m{-}(\overset{O}{\overset{\|}{C}}{-}(CH_2)_vO)_n]_x\overset{O}{\overset{\|}{P}}{-}(OH)_{3-x} \qquad (1)$$

(In formula (1), $R^1$ is a (meth)acryl group or an allyl group, $R^2$ is a linear or branched alkylene group, in is an integer of 1 to 30, n is 0 or 1, v is an integer of 1 to 10, and x is 1 or 2.)

In one embodiment, the hollow resin particles used in a resin composition for semiconductor members according to an embodiment of the present invention has a specific surface area of 1 $m^2/g$ to 30 $m^2/g$.

In one embodiment, the hollow resin particles used in a resin composition for semiconductor members according to an embodiment of the present invention has a bulk specific gravity of 0.01 $g/cm^3$ to 0.6 $g/cm^3$.

In one embodiment, the hole part inside the particle has a porous structure.

In one embodiment, the hole part inside the particle has a single hollow structure.

A semiconductor member according to an embodiment of the present invention contains the hollow resin particles used in a resin composition for semiconductor members according to an embodiment of the present invention.

Advantageous Effects of Invention

According to an embodiment of the present invention, there can be provided hollow resin particles used in a resin composition for semiconductor members, which can be used in a resin composition for semiconductor members to provide a semiconductor member capable of exerting excellent low dielectric properties.

DESCRIPTION OF EMBODIMENTS

Figure 1:
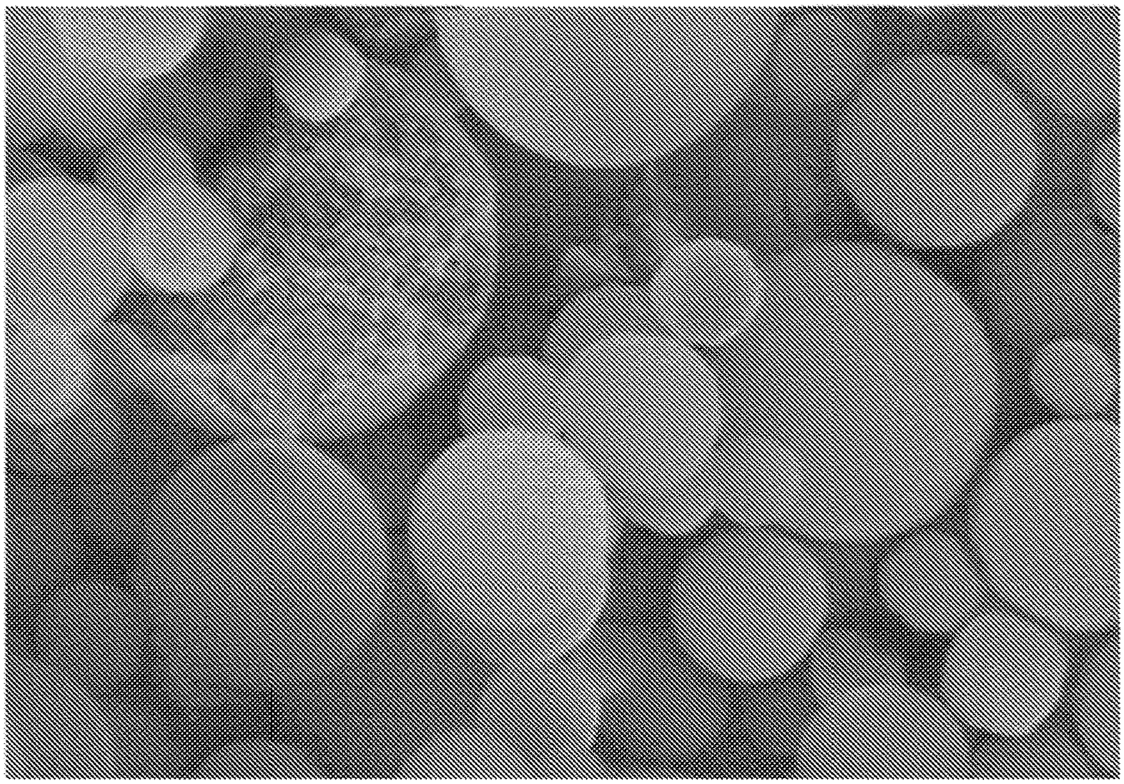
FIG. 1 is a surface SEM image of resin particles (1) obtained in Example 1.

Hereinafter, embodiments of the present invention will be described, but the present invention is not limited to these embodiments.

As described herein, the semiconductor member denotes a member that constitutes a semiconductor, and examples thereof include a semiconductor package and a semiconductor module. As described herein, the resin composition for semiconductor members denotes a resin composition used in semiconductor members. Therefore, the hollow resin particles used in a resin composition for semiconductor members according to an embodiment of the present invention are used in a resin composition for semiconductor members and thus suitably used in semiconductor members such as a semiconductor package and a semiconductor module. Such a semiconductor member is a semiconductor member according to an embodiment of the present invention and contains the hollow resin particles used in a resin composition for semiconductor members according to an embodiment of the present invention.

The semiconductor package includes an IC chip as an essential constituent member and at least one member selected from a mold resin, an underfill material, a mold underfill material, a die bonding material, a prepreg for semiconductor package substrates, a metal-clad laminated board for semiconductor package substrates, and a build-up material of a printed circuit board for semiconductor packages.

The semiconductor module includes a semiconductor package as an essential constituent member and at least one member selected from a prepreg for printed circuit boards, a metal-clad laminated board for printed circuit boards, a build-up material for printed circuit boards, a solder resist material, a coverlay film, an electromagnetic wave shielding film, and an adhesive sheet for printed circuit boards.

As described herein, the expression "(meth)acryl", if any, denotes "acryl and/or methacryl"; the expression "(meth) acrylate", if any, denotes "acrylate and/or methacrylate"; the expression "(meth)allyl", if any, denotes "allyl and/or methallyl"; and the expression "(meth)acrolein", if any, denotes "acrolein and/or methacrolein". Also, as described herein, the expression "acids (salts)", if any, denotes "acids and/or salts thereof". Examples of the salts include alkali metal salts and alkali earth metal salts and specifically include sodium salts, potassium salts, and the like.

<<Hollow Resin Particles>>

The hollow resin particles according to an embodiment of the present invention are used in a resin composition for semiconductor members. The resin composition for semiconductor members is, as previously described, a resin composition used in semiconductor members. Such a resin composition typically contains insulating resin. As such insulating resin, optional appropriate resin can be adopted within a scope that does not impair the effects of the present invention. Examples of such insulating resin include polyphenylene ether, polyphenylene sulfide, polyimide, polyether imide, polybismaleimide, polyarylate, epoxy resin, polyester resin, urethane resin, acrylic resin, cyanate resin, phenol resin, polystyrene resin, fluorine resin such as PTFE, and cycloolefin resin.

The hollow resin particles used in a resin composition for semiconductor members according to an embodiment of the present invention are hollow resin particles having a hole part inside the particle. As a structure of the hole part inside the particle, an optional appropriate structure can be adopted within a scope that does not impair the effects of the present invention. Since the effects of the present invention can be further exerted, such a structure includes a porous structure and a single hollow structure. The hole part described herein denotes a state in which the inside is filled with a substance other than resin, for example, with gas, liquid, or the like, and preferably with gas in that the effects of the present invention can be further exerted.

The volume average particle diameter of the hollow resin particles is preferably 0.5 μm to 100 μm, more preferably 1.0 μm to 80 μm, further preferably 1.5 μm to 60 μm, and particularly preferably 2.0 μm to 40 μm. When the volume average particle diameter of the hollow resin particles is within the above-described range, the effects of the present invention can be further exerted. When the volume average particle diameter of the hollow resin particles is outside the above-described range and excessively small, the thickness of the surface layer part of the particle becomes relatively thin, and thus there is a risk that the hollow resin particles may not have sufficient mechanical strength. When the volume average particle diameter of the hollow resin particles is outside the above-described range and excessively large, there is a risk that phase separation between a solvent and a polymer generated by the polymerization of monomer components may be unlikely to occur during suspension polymerization, leading to difficulty in forming a surface layer. It is noted that the volume average particle diameter of the hollow resin particles can be obtained by a later-described Coulter method.

In the hollow resin particles used in a resin composition for semiconductor members according to an embodiment of the present invention, a decreasing rate of a relative dielectric constant Dk1 of a film (F1) formulated with 80 parts by weight of polyimide and 20 parts by weight of the hollow resin particles to a relative dielectric constant Dk0 of a film (F0) formed with only the polyimide is preferably 3% or more, more preferably 5% or more, further preferably 10% or more, and particularly preferably 15% or more. The decreasing rate of the relative dielectric constant Dk1 of the film (F1) to the relative dielectric constant Dk0 of the film (F0) is desirably as large as possible but realistically 35% or less. When the decreasing rate of the relative dielectric constant Dk1 of the film (F1) to the relative dielectric constant Dk0 of the film (F0) is within the above-described range, the effects of the present invention can be further exerted. When the decreasing rate of the relative dielectric constant Dk1 of the film (F1) to the relative dielectric constant Dk0 of the film (F0) is outside the above-described range and excessively small, there is a risk that the hollow resin particles used in a resin composition for semiconductor members according to an embodiment of the present invention cannot exert excellent low dielectric properties.

It is noted that the decreasing rate of the relative dielectric constant Dk1 of the film (F1) to the relative dielectric constant Dk0 of the film (F0) is calculated according to the following formula.

$$\text{Decreasing rate (\%) of relative dielectric constant } Dk1 \text{ of film } (F1) \text{ to relative dielectric constant } Dk0 \text{ of film } (F0)=[(Dk0-Dk1)/Dk0]\times 100$$

In the hollow resin particles used in a resin composition for semiconductor members according to an embodiment of the present invention, a decreasing rate of a dielectric loss tangent Df1 of the film (F1) to a dielectric loss tangent Df0 of the film (F0) is preferably 3% or more, more preferably 5% or more, further preferably 10% or more, and particularly preferably 15% or more. The decreasing rate of the dielectric loss tangent Df1 of the film (F1) to the dielectric loss tangent Df0 of the film (F0) is desirably as large as possible but realistically 35% or less. When the decreasing rate of the dielectric loss tangent Df1 of the film (F1) to the dielectric loss tangent Df0 of the film (F0) is within the above-described range, the effects of the present invention can be further exerted. When the decreasing rate of the dielectric loss tangent Df1 of the film (F1) to the dielectric loss tangent Df0 of the film (F0) is outside the above-described range and excessively small, there is a risk that the hollow resin particles used in a resin composition for semiconductor members according to an embodiment of the present invention cannot exert excellent low dielectric properties.

The decreasing rate of the dielectric loss tangent Df1 of the film (F1) to the dielectric loss tangent Df0 of the film (F0) is calculated according to the following formula.

$$\text{Decreasing rate (\%) of dielectric loss tangent } Df1 \text{ of film } (F1) \text{ to dielectric loss tangent } Df0 \text{ of film } (F0)=[(Df0-Df1)/Df0]\times 100$$

In the hollow resin particles used in a resin composition for semiconductor members according to an embodiment of the present invention, the specific surface area is preferably 1 $m^2/g$ to 30 $m^2/g$, more preferably 1 $m^2/g$ to 25 $m^2/g$, further preferably 1 $m^2/g$ to 20 $m^2/g$, and particularly preferably 1 $m^2/g$ to 15 $m^2/g$. When the specific surface area is within the above-described range, the effects of the present invention can be further exerted. When the specific surface area is outside the above-described range and excessively small, voids are likely to be generated at the interface between the particle and the insulating resin, and thus there is a risk that the strength of the insulating resin material may decrease, and low hygroscopicity may deteriorate. When the specific surface area is outside the above-described range and excessively large, there is a risk that the strength of the hollow resin particles may decrease, so that the particles are broken in the production process, and thus the hollow part cannot be retained.

In the hollow resin particles used in a resin composition for semiconductor members according to an embodiment of the present invention, the bulk specific gravity is preferably 0.01 $g/cm^3$ to 0.6 $g/cm^3$, more preferably 0.02 $g/cm^3$ to 0.55 $g/cm^3$, further preferably 0.03 $g/cm^3$ to 0.5 $g/cm^3$, and particularly preferably 0.05 $g/cm^3$ to 0.45 $g/cm^3$. When the bulk specific gravity is outside the above-described range and excessively small, there is a risk that the strength of the hollow resin particles may decrease, so that the particles are broken in the production process, and thus the hollow part cannot be retained. When the bulk specific gravity is outside the above-described range and excessively large, there is a risk that the hollow part may be reduced, so that sufficient low dielectric properties cannot be exerted.

The hollow resin particles used in a resin composition for semiconductor members according to an embodiment of the present invention preferably include a polymer (P) that contains at least one selected from the group consisting of a vinyl-based monomer-derived structural unit (I) and a phosphoric acid ester-based monomer-derived structural unit (II).

Typically, in the hollow resin particles used in a resin composition for semiconductor members according to an embodiment of the present invention, the main component is the polymer (P) that contains at least one selected from the group consisting of a vinyl-based monomer-derived structural unit (I) and a phosphoric acid ester-based monomer-derived structural unit (II). Here, the "main component" denotes that the content ratio in the entirety is preferably 50% by weight or more, more preferably 70% by weight or more, further preferably 90% by weight or more, particularly preferably 95% by weight or more, and most preferably 98% by weight or more.

The content ratio of the polymer (P) in the hollow resin particles used in a resin composition for semiconductor members according to an embodiment of the present invention is preferably 50% by weight to 100% by weight, more preferably 70% by weight to 100% by weight, further preferably 90% by weight to 100% by weight, particularly preferably 95% by weight to 100% by weight, and most preferably 98% by weight to 100% by weight.

The polymer (P) is preferably a polymer that contains both the vinyl-based monomer-derived structural unit (I) and the phosphoric acid ester-based monomer-derived structural unit (II).

As described herein, all monomer components used for producing the polymer (P) are sometimes referred to as a monomer composition.

The vinyl-based monomer-derived structural unit (I) is a structural unit that is formed when a vinyl-based monomer was polymerized as one of all monomer components used for producing the polymer (P). As such a vinyl-based monomer, an optional appropriate vinyl-based resin can be adopted within a scope that does not impair the effects of the present invention. The vinyl-based monomer may be used alone or in combination of two or more kinds thereof.

Examples of the vinyl-based monomer include a monofunctional vinyl-based monomer having one ethylene-based unsaturated group and a multifunctional vinyl-based monomer having two or more ethylene-based unsaturated groups.

Examples of the monofunctional vinyl-based monomer having one ethylene-based unsaturated group include a styrene-based monomer, a carboxyl group-containing monomer, a (meth)acrylic acid alkyl ester, a hydroxyl group-containing monomer, a nitrogen atom-containing monomer, an epoxy group-containing monomer, a sulfonic acid group-containing monomer, a phosphoric acid group-containing monomer, a (meth)acrylic acid alkoxyalkyl ester, a (meth)acrylic acid ester having an aromatic hydrocarbon group, vinyl esters, an aromatic vinyl compound, olefins, vinyl ethers, and vinyl chloride.

Examples of the styrene-based monomer include styrene, ethylvinylbenzene, methylstyrene, vinyl toluene, o-chlorostyrene, m-chlorostyrene, p-chlorostyrene, vinyl biphenyl, and vinyl naphthalene.

Examples of the carboxyl group-containing monomer include (meth)acrylic acid, itaconic acid, maleic acid, fumaric acid, crotonic acid, isocrotonic acid, and acid anhydride thereof (for example, maleic anhydride and itaconic anhydride).

Examples of the (meth)acrylic acid alkyl ester include (meth)acrylic acid alkyl esters having an alkyl group with 1 to 20 carbon atoms, such as methyl (meth)acrylate, ethyl (meth)acrylate, propyl (meth)acrylate, isopropyl (meth) acrylate, n-butyl (meth)acrylate, isobutyl (meth)acrylate, s-butyl (meth)acrylate, t-butyl (meth)acrylate, pentyl (meth)

acrylate, isopentyl (meth)acrylate, hexyl (meth)acrylate, heptyl (meth)acrylate, octyl (meth)acrylate, 2-ethylhexyl (meth)acrylate, isooctyl (meth)acrylate, nonyl (meth)acrylate, isononyl (meth)acrylate, decyl (meth)acrylate, isodecyl (meth)acrylate, undecyl (meth)acrylate, dodecyl (meth) acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth)acrylate, eicosyl (meth)acrylate, cyclopentyl (meth) acrylate, cyclohexyl (meth)acrylate, and isobornyl (meth) acrylate. It is noted that the alkyl group described herein includes an alkyl group having an alicyclic hydrocarbon group or an alicyclic hydrocarbon group. Since the stability of the dispersion liquid during suspension polymerization is excellent with the result that the hollow resin particles having high mechanical strength are likely to be obtained, the alkyl group is preferably an alkyl group with 1 to 8 carbon atoms and more preferably an alkyl group with 1 to 4 carbon atoms.

Examples of the hydroxyl group-containing monomer include a hydroxyl group-containing (meth)acrylic acid ester, vinyl alcohol, and allyl alcohol. Examples of the hydroxyl group-containing (meth)acrylic acid ester include 2-hydroxyethyl (meth)acrylate, 3-hydroxypropyl (meth) acrylate, 4-hydroxybutyl (meth)acrylate, 6-hydroxyhexyl (meth)acrylate, hydroxyoctyl (meth)acrylate, hydroxydecyl (meth)acrylate, hydroxylauryl (meth)acrylate, and (4-hydroxymethylcyclohexyl) (meth)acrylate.

The nitrogen atom-containing monomer is a monomer having at least one nitrogen atom in the molecule. As described herein, the monomer having in the molecule both a hydroxyl group and a nitrogen atom is not included in the hydroxyl group-containing monomer but is included in the nitrogen atom-containing monomer. Examples of the nitrogen atom-containing monomer include N-vinyl cyclic amide, (meth)acrylamides, an amino group-containing monomer, a cyano group-containing monomer, a heterocyclic ring-containing monomer, an imide group-containing monomer, and an isocyanate group-containing monomer.

Examples of the N-vinyl cyclic amide include N-vinyl-2-pyrrolidone (NVP), N-vinyl-2-piperidone, N-vinyl-3-morpholinone, N-vinyl-2-caprolactam, N-vinyl-1,3-oxazine-2-one, and N-vinyl-3,5-morpholinedione.

Examples of the (meth)acrylamides include (meth)acrylamide, N-alkyl (meth)acrylamide, N,N-dialkyl (meth)acrylamide, N-hydroxyalkyl (meth)acrylamide, and N-alkoxyalkyl (meth)acrylamide.

Examples of the N-alkyl (meth)acrylamide include N-ethyl (meth)acrylamide, N-isopropyl (meth)acrylamide, N-n-butyl (meth)acrylamide, and N-octyl (meth)acrylamide. Further examples of the N-alkyl (meth)acrylamide include (meth)acrylamide having an amino group, such as dimethylaminoethyl (meth)acrylamide, diethylaminoethyl (meth) acrylamide, and dimethylaminopropyl (meth)acrylamide.

Examples of the N,N-dialkyl (meth)acrylamide include N,N-dimethyl (meth)acrylamide, N,N-diethyl (meth)acrylamide, N,N-dipropyl (meth)acrylamide, N,N-diisopropyl (meth)acrylamide, N,N-di(n-butyl) (meth)acrylamide, and N,N-di(t-butyl) (meth)acrylamide.

Examples of the N-hydroxyalkyl (meth)acrylamide include N-methylol (meth)acrylamide, N-(2-hydroxyethyl) (meth)acrylamide, N-(2-hydroxypropyl) (meth)acrylamide, N-(1-hydroxypropyl) (meth)acrylamide, N-(3-hydroxypropyl) (meth)acrylamide, N-(2-hydroxybutyl) (meth)acrylamide, N-(3-hydroxybutyl) (meth)acrylamide, N-(4-hydroxybutyl) (meth)acrylamide, and N-methyl-N-2-hydroxyethyl (meth)acrylamide.

Examples of the N-alkoxyalkyl (meth)acrylamide include N-methoxymethyl (meth)acrylamide and N-butoxymethyl (meth)acrylamide.

Examples of the amino group-containing monomer include aminoethyl (meth)acrylate, dimethylaminoethyl (meth)acrylate, dimethylaminopropyl (meth)acrylate, and t-butylaminoethyl (meth)acrylate.

Examples of the cyano group-containing monomer include acrylonitrile and methacrylonitrile.

Examples of the heterocyclic ring-containing monomer include (meth)acryloylmorpholine, N-vinylpiperazine, N-vinylpyrrole, N-vinylimidazole, N-vinylpyrazine, N-vinylmorpholine, N-vinylpyrazole, vinyl pyridine, vinyl pyrimidine, vinyl oxazol, vinyl isoxazol, vinyl thiazole, vinyl isothiazole, vinyl pyridazine, (meth)acryloylpyrrolidone, (meth)acryloylpyrrolidine, (meth)acryloylpiperidine, and N-methylvinylpyrrolidone.

Examples of the imide group-containing monomer include maleimide-based monomers such as N-cyclohexylmaleimide, N-isopropylmaleimide. N-laurylmaleimide, and N-phenylmaleimide; itaconimide-based monomers such as N-methylitaconimide, N-ethylitaconimide, N-butylitaconimide, N-octylitaconimide, N-2-ethylhexylitaconimide, N-laurylitaconimide, and N-cyclohexylitaconimide; and succinimide-based monomers such as N-(meth)acryloyloxymethylenesuccinimide, N-(meth)acryloyl-6-oxyhexamethylenesuccinimide, and N-(meth)acryloyl-8-oxyoctamethylenesuccinimide.

An example of the isocyanate group-containing monomer is 2-(meth)acryloyloxyethylisocyanate.

Examples of the epoxy group-containing monomer include glycidyl (meth)aclyrate and methylglycidyl (meth) acrylate.

An example of the sulfonic acid group-containing monomer is sodium vinylsulfonate.

Examples of the (meth)acrylic acid alkoxyalkyl ester include 2-methoxyethyl (meth)acrylate, 2-ethoxyethyl (meth)acrylate, methoxytriethyleneglycol (meth)acrylate, 3-methoxypropyl (meth)acrylate, 3-ethoxypropyl (meth) acrylate, 4-methoxybutyl (meth)acrylate, and 4-ethoxybutyl (meth)acrylate.

Examples of the (meth)acrylic acid ester having an aromatic hydrocarbon group include phenyl (meth)acrylate, phenoxyethyl (meth)acrylate, and benzyl (meth)acrylate.

Examples of the vinyl esters include vinyl acetate and vinyl propionate.

Examples of the aromatic vinyl compound include styrene and vinyl toluene.

Examples of the olefins include ethylene, butadiene, isoprene, and isobutylene.

An example of the vinyl ethers is vinyl alkyl ether.

Examples of the multifunctional vinyl-based monomer having two or more ethylene-based unsaturated groups include a multifunctional (meth)acrylic acid ester-based monomer and an aromatic divinyl-based monomer.

Examples of the multifunctional (meth)acrylic acid ester-based monomer include ethylene glycol di(meth)acrylate, diethylene glycol di(meth)acrylate, triethylene glycol di(meth)acrylate, tetraethylene glycol di(meth)acrylate, nonacthylene glycol di(meth)acrylate, tetradecaethylene glycol di(meth)acrylate, decaethylene glycol di(meth)acrylate, pentadecaethylene glycol di(meth)acrylate, 1,3-butylene glycol di(meth)acrylate, 1,4-butanediol di(meth)acrylate, 1,6-hexanediol di(meth)acrylate, glycerin di(meth)acrylate, trimethylolpropane tri(meth)acrylate, pentaerythritol tetra (meth)acrylate, phthalic acid diethylene glycol di(meth) acrylate, caprolactone-modified dipentaerythritol hexa(m- eth)acrylate, caprolactone-modified hydroxypivalic acid ester neopentyl glycol di(meth)acrylate, polyester (meth) acrylate, and urethane (meth)acrylate.

Examples of the aromatic divinyl-based monomer include divinyl benzene, divinyl naphthalene, and derivatives thereof.

Since the effects of the present invention can be further exerted, the vinyl-based monomer preferably contains the multifunctional vinyl-based monomer. The content ratio of the multifunctional vinyl-based monomer in the total amount of the vinyl-based monomer is preferably 3% by weight to 70% by weight, more preferably 5% by weight to 50% by weight, further preferably 7% by weight to 45% by weight, and particularly preferably 10% by weight to 40% by weight, in that the effects of the present invention can be further exerted. When the content ratio of the multifunctional vinyl-based monomer in the total amount of the vinyl-based monomer is outside the above-described range and excessively small, there is a risk that the hole part may be unlikely to be formed inside the particle. When the content ratio of the multifunctional vinyl-based monomer in the total amount of the vinyl-based monomer is outside the above-described range and excessively large, there is a risk that the obtained hollow resin particles may increase in surface shrinkage, and thus the mechanical strength may be weakened.

The phosphoric acid ester-based monomer-derived structural unit (II) is a structural unit that is formed when a phosphoric acid ester-based monomer was polymerized as one of all monomer components used for producing the polymer (P). As such a phosphoric acid ester-based monomer, an optional appropriate phosphoric acid ester-based resin can be adopted within a scope that does not impair the effects of the present invention. The phosphoric acid ester-based monomer may be used alone or in combination of two or more kinds thereof.

The phosphoric acid ester-based monomer preferably has an ethylene-based unsaturated group, in that it can be copolymerized with the vinyl-based monomer near the droplet surface during suspension polymerization to increase particle hardness.

The phosphoric acid ester-based monomer is preferably an acidic phosphoric acid ester-based monomer, in that it is likely to be oriented to the droplet surface during suspension polymerization and acts with an inorganic-based dispersant to increase hardness near the particle surface.

The acidic phosphoric acid ester-based monomer having an ethylene-based unsaturated group is preferably a phosphoric acid ester-based monomer represented by formula (1), in that the effects of the present invention can be further exerted.

(1)

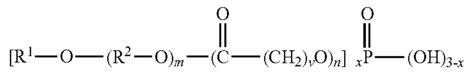

In formula (1), $R^1$ is a (meth)acryl group or an allyl group, $R^2$ is a linear or branched alkylene group, m is an integer of 1 to 30, n is 0 or 1, v is an integer of 1 to 10, and x is 1 or 2.

Since the effects of the present invention can be further exerted, the phosphoric acid ester-based monomer represented by formula (1) is preferably caprolactone EO-modified phosphoric acid dimethacrylate represented by formula (2), polyoxypropylene allyl ether phosphoric acid ester represented by formula (3), and 2-methacryloyloxyethyl acid phosphate.

(2)

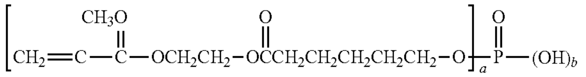

In formula (2), a and b are a=1 and b=2, or a=2 and b=1.

(3)

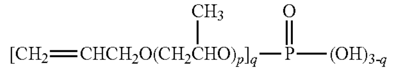

In formula (3), p is an integer of 1 to 30. q is 1 or 2.

An example of the caprolactone EO-modified phosphoric acid dimethacrylate represented by formula (2) is a commercially available "KAYAMER PM-21" (product name) manufactured by Nippon Kayaku Co., Ltd.

An example of the polyoxypropylene allyl ether phosphoric acid ester represented by formula (3) is a commercially available "ADEKA REASOAP PP-70" (product name) manufactured by ADEKA Corporation.

In the hollow resin particles used in a resin composition for semiconductor members according to an embodiment of the present invention, in which the polymer (P) as the main component is a polymer that contains both the vinyl-based monomer-derived structural unit (I) and the phosphoric acid ester-based monomer-derived structural unit (II), the content of the phosphoric acid ester-based monomer in all monomer components used for producing the polymer, relative to 100 parts by weight of the vinyl-based monomer, is preferably 0.001 part by weight to 5 parts by weight, more preferably 0.01 part by weight to 3 parts by weight, further preferably 0.03 part by weight to 1 part by weight, and particularly preferably 0.05 part by weight to 0.8 part by weight. When the content of the phosphoric acid ester-based monomer relative to 100 parts by weight of the vinyl-based monomer is within the above-described range, the effects of the present invention can be further exerted.

The hollow resin particles used in a resin composition for semiconductor members according to an embodiment of the present invention may contain an optional appropriate additional component within a scope that does not impair the effects of the present invention, other than the polymer (P) that contains at least one selected from the group consisting of a vinyl-based monomer-derived structural unit (I) and a phosphoric acid ester-based monomer-derived structural unit (II). Such an additional component may be used alone or in combination of two or more kinds thereof. Examples of such an additional component include a pigment, an antioxidant, a flavor, a UV protective agent, a surfactant, a preservative, and a medically effective component.

<<Production Method of Hollow Resin Particles>>

The hollow resin particles used in a resin composition for semiconductor members according to an embodiment of the present invention can be produced by an optional appropriate method within a scope that does not impair the effects of the present invention.

Such a production method includes, for example, a dispersing step (step 1), a polymerizing step (step 2), a washing step (step 3), and a drying step (step 4).

<Step 1: Dispersing Step>

Step 1 is a step of dispersing, in an aqueous solution that contains a dispersant, an organic mixed solution including a monomer composition that contains at least one selected from the group consisting of a vinyl-based monomer and a phosphoric acid ester-based monomer, a polymerization initiator, and a non-polymerizable organic compound.

As long as the organic mixed solution can exist in a droplet state in the aqueous solution, an optional appropriate dispersing method can be adopted for dispersing the organic mixed solution in the aqueous solution, within a scope that does not impair the effects of the present invention. As such a dispersing method, a dispersing method using a homomixer or a homogenizer is typically used.

The aqueous solution contains an aqueous medium and a dispersant.

Examples of the aqueous medium include water and a mixed medium of water and lower alcohol (such as methanol or ethanol). As water, at least one selected from deionized water, ion exchanged water, and distilled water is preferable.

As the dispersant, an optional appropriate dispersant can be adopted within a scope that does not impair the effects of the present invention. Examples of such a dispersant include an inorganic-based dispersant and a surfactant. Since the effects of the present invention can be further exerted, the inorganic-based dispersant is preferably adopted as a dispersant. The dispersant may be used alone or in combination of two or more kinds thereof.

Examples of the inorganic-based dispersant include poorly water-soluble salts such as pyrophosphoric acid salts of alkaline earth metal (such as magnesium pyrophosphate), phosphoric acid salts of alkaline earth metal (such as tricalcium phosphate), calcium carbonate, and barium carbonate; inorganic dispersants such as silica and zirconium oxide; and inorganic polymer substances such as talc, bentonite, silicic acid, diatomaceous earth, and clay. The alkaline earth metal as described herein is preferably magnesium and calcium. Of these, the pyrophosphoric acid salts of alkaline earth metal and the phosphoric acid salts of alkaline earth metal are preferable, in that metal ions interact with the phosphoric acid ester part in the phosphoric acid ester-based monomer to form a dense coat on the surface layer, with the result that the hollow resin particles having high mechanical strength can be obtained.

The added amount of the inorganic-based dispersant, relative to 100 parts by weight of the monomer composition (all monomer components used for producing the polymer (P) as the main component of the hollow resin particles), is preferably 0.1 part by weight to 30 parts by weight and more preferably 0.5 part by weight to 20 parts by weight, in that stability of oil droplets can be ensured to obtain hollow resin particles having a uniform particle diameter.

Examples of the surfactant include an anionic surfactant, a cationic surfactant, a zwitterionic surfactant, a nonionic surfactant, and the like.

Examples of the anionic surfactant include non-reactive anionic surfactants such as alkyl sulfuric acid ester fatty acid salts, alkyl benzene sulfonic acid salts, alkyl naphthalene sulfonic acid salts, alkane sulfonic acid salts, alkyl diphenyl ether sulfonic acid salts, dialkyl sulfosuccinic acid salts, monoalkyl sulfosuccinic acid salts, and polyoxyethylene alkyl phenyl ether phosphoric acid salts, and reactive anionic surfactants such as polyoxyethylene-1-(allyloxymethyl)alkyl ether sulfuric acid ester ammonium salts, polyoxyethylene alkyl propenyl phenyl ether sulfuric acid ester ammonium salts, and polyoxyalkylene alkenyl ether ammonium sulfate.

Examples of the cationic surfactant include cationic surfactants such as alkyl trimethyl ammonium salts, alkyl triethyl ammonium salts, dialkyl dimethyl ammonium salts, dialkyl diethyl ammonium salts, and N-polyoxyalkylene-N,N,N-trialkyl ammonium salts.

Examples of the zwitterionic surfactant include lauryl dimethylamine oxide, phosphoric acid ester salts, phosphorous acid ester-based surfactants, and the like.

Examples of the nonionic surfactant include polyoxyethylene alkyl ether, polyoxyethylene alkyl phenyl ether, polyoxyethylene fatty acid ester, sorbitan fatty acid ester, polysorbitan fatty acid ester, polyoxyethylene alkylamine, glycerin fatty acid ester, oxyethylene-oxypropylene block polymers, and the like.

The added amount of the surfactant, relative to 100 parts by weight of the organic mixed solution, is preferably 0.01 part by weight to 1 part by weight. The surfactant may be used alone or in combination of two or more kinds thereof.

The aqueous solution may contain an optional appropriate additional component within a scope that does not impair the effects of the present invention.

The organic mixed solution contains a monomer composition that contains at least one selected from the group consisting of a vinyl-based monomer and a phosphoric acid ester-based monomer, a polymerization initiator, and a non-polymerizable organic compound.

As the monomer composition contained in the organic mixed solution, the description in the heading <<Hollow resin particles>> can be incorporated as it is.

As the polymerization initiator, an optional appropriate polymerization initiator can be adopted within a scope that does not impair the effects of the present invention.

The polymerization initiator preferably has a 10-hour half-life temperature of 90° C. or lower. When such a polymerization initiator is used, the polymerization initiator remaining in the hollow resin particles can be completely decomposed. For example, when a semiconductor member including the hollow resin particles is heated by reflow soldering or the like, oxidation degradation of resin and gas generation caused by the remaining polymerization initiator can be suppressed.

The polymerization initiator is preferably such that polymerization is performed with a combination of a reaction temperature and a reaction time under which the decomposition rate of the polymerization initiator calculated by the following formula becomes 98% or more. Under such a polymerization condition, the polymerization initiator remaining in the hollow resin particles can be completely decomposed. For example, when a semiconductor member including the hollow resin particles is heated by reflow soldering or the like, oxidation degradation of resin and gas generation caused by the remaining polymerization initiator can be suppressed.

$$\text{Decomposition rate } (\%)=(1-\exp(-k_{dt}))\times 100$$

$$kd=A\exp(-\Delta E/RT)$$

In the above-described formula, $k_d$ represents a pyrolysis rate constant; t represents a reaction time (hr); A represents a frequency factor ($hr^{-1}$); ΔE represents an activation energy (J/mol); R represents a gas constant (8.314 J/mol·K); and T represents a reaction temperature (K).

Examples of the polymerization initiator include organic peroxides such as lauroyl peroxide, benzoyl peroxide, orthochlorobenzoyl peroxide, orthomethoxybenzoyl peroxide, 3,5,5-trimethylhexanoyl peroxide, t-butylperoxy-2-ethylhexanoate, and di-t-butyl peroxide; and azo-based compounds such as 2,2'-azobisisobutyronitrile, 1,1'-azobiscyclohexanecarbonitrile, and 2,2'-azobis(2,4-dimethylvaleronitrile).

The added amount of the polymerization initiator, relative to 100 parts by weight of the monomer composition (all monomer components used for producing the polymer (P) as the main component of the hollow resin particles), is preferably 0.01 part by weight to 10 parts by weight, more preferably 0.01 part by weight to 5 parts by weight, and further preferably 0.1 part by weight to 5 parts by weight. The polymerization initiator may be used alone or in combination of two or more kinds thereof.

The non-polymerizable organic compound has a function as a so-called solvent and also contributes to the formation of the hole part having a porous structure or a single hollow structure inside the particle of the hollow resin particles.

As such a non-polymerizable organic compound, an organic solvent having a boiling point of 30° C. or higher and 200° C. or lower is preferably used, because it exists as a liquid in a temperature range in which the polymerizing step (step 2) is performed. More specifically, the usable non-polymerizable organic compound is one or more selected from the group consisting of saturated aliphatic hydrocarbons such as n-pentane, isopentane, n-hexane, cyclohexane, and n-pentane; aromatic compounds such as toluene and benzene; acetic acid ester-based compounds such as ethyl acetate and butyl acetate; and fluorine-based compounds such as hydrofluoroether and hydrofluorocarbon.

Since the effects of the present invention can be further exerted, the added amount of the non-polymerizable organic compound, relative to 100 parts by weight of the monomer composition (all monomer components used for producing the polymer (P) as the main component of the hollow resin particles), is preferably 10 parts by weight to 250 parts by weight. When the use amount of the non-polymerizable organic compound relative to 100 parts by weight of the monomer composition is outside the above-described range and excessively small, there is a risk that the hole part having a porous structure or a single hollow structure cannot be reliably formed inside the particle of the hollow resin particles. When the use amount of the non-polymerizable organic compound relative to 100 parts by weight of the monomer composition is outside the above-described range and excessively large, there is a risk that sufficient strength cannot be imparted to the obtained hollow resin particles.

The organic mixed solution may contain an optional appropriate additional component within a scope that does not impair the effects of the present invention.

<Step 2: Polymerizing Step>

Step 2 is a step of heating the dispersion liquid obtained in step 1 for suspension polymerization.

The polymerization temperature may be an optional appropriate polymerization temperature within a scope that does not impair the effects of the present invention, as long as it is a temperature suitable for suspension polymerization. Such a polymerization temperature is preferably 30° C. to 105° C.

The polymerization time may be an optional appropriate polymerization time within a scope that does not impair the effects of the present invention, as long as it is a time suitable for suspension polymerization. Such a polymerization time is preferably 0.1 hour to 20 hours.

Post-heating preferably performed after polymerization is a treatment suitable for obtaining hollow resin particles with high perfection.

The temperature of the post-heating preferably performed after polymerization may be an optional appropriate polymerization temperature within a scope that does not impair the effects of the present invention. Such a temperature of the post-heating is preferably 50° C. to 120° C.

The time of the post-heating preferably performed after polymerization may be an optional appropriate polymerization time within a scope that does not impair the effects of the present invention. Such a time of the post-heating is preferably 1 hour to 10 hours.

<Step 3: Washing Step>

Step 3 is a step of washing the slurry obtained in step 2.

The washing method may be an optional appropriate washing method within a scope that does not impair the effects of the present invention. Examples of such a washing method include: (1) a method of removing impurities after forming hollow resin particles by repeating multiple times an operation of depositing the hollow resin particles using a high-speed centrifuge or the like with extraordinarily high centrifugal acceleration, removing the supernatant, and newly adding ion exchanged water or distilled water to disperse the deposited hollow resin particles in the ion exchanged water; (2) a method of removing impurities by performing washing by a cross-flow filtration method using a ceramic filter or the like; and (3) a method of adding, to hollow resin particles, a solvent to serve as an aggregating agent of particles thereby to cause particles to aggregate and settle in the solvent, separating the hollow resin particles using a filter or the like, and washing the particles with a washing solvent; and the like.

In the washing method of (1), washing is preferably performed with ion exchanged water or distilled water in an amount of 5 times or more the weight of the slurry.

The hollow resin particles having a small specific gravity are preferably washed by the cross-flow filtration method using a ceramic filter or the like of (2).

<Step 4: Drying Step>

Step 4 is a step of drying the slurry after washing obtained in step 3.

The drying method may be an optional appropriate washing method within a scope that does not impair the effects of the present invention. An example of such a drying method is drying by heating.

The temperature of the heating may be an optional appropriate temperature within a scope that does not impair the effects of the present invention. Such a temperature of the heating is preferably 50° C. to 120° C.

The time of the heating may be an optional appropriate time within a scope that does not impair the effects of the present invention. Such a time of the heating is preferably 1 hour to 50 hours.

EXAMPLES

Hereinafter, the present invention will be specifically described with reference to examples, but the present invention is not limited to these examples. It is noted that unless otherwise stated, "parts" denotes "parts by weight", and "%" denotes "% by weight".

<Measurement of Volume Average Particle Diameter>

The volume average particle diameter of particles was measured by a Coulter method as described below.

The volume average particle diameter of particles was measured by a Coulter Multisizer (registered trademark) 3 (a measuring device of Beckman Coulter, Inc.). The measurement was performed using an aperture calibrated in accordance with Multisizer (registered trademark) 3 User's Manual issued by Beckman Coulter, Inc. The aperture used for the measurement was appropriately selected according to the size of particles to be measured. Current (aperture current) and Gain were appropriately set according to the size of the selected aperture. For example, when the aperture having a size of 50 μm was selected, Current (aperture current) was set to −800, and Gain was set to 4.

A used sample for measurement was a dispersion liquid obtained by dispersing 0.1 g of particles in 10 ml of a 0.1% by weight nonionic surfactant aqueous solution using a touch mixer ("TOUCH MIXER MT-31" manufactured by Yamato Scientific Co., Ltd.) and an ultrasonic cleaner ("ULTRASONIC CLEANER VS-150" manufactured by VELVO-CLEAR Co.). During the measurement, the inside of the beaker was previously stirred gently to such a degree that no air bubbles enter. The measurement was terminated at the time when 100,000 particles were measured. The volume average particle diameter of particles was defined as the arithmetic average in the volume-based particle size distribution of 100,000 particles.

<Bulk Specific Gravity>

The bulk specific gravity of particles was measured in accordance with JIS K 5101-12-1 (Test methods for pigments—Part 12: Apparent density or apparent specific volume—Section 1: Loose packing method).

<Specific Surface Area>

The specific surface area of particles was measured by the BET method (nitrogen adsorption method) described in JIS Z 8830:2001 of ISO 9277, first edition. The BET nitrogen adsorption isotherm of target particles was measured using an automated specific surface area/pore distribution measuring device "Tristar II" manufactured by Shimadzu Corporation. From the nitrogen adsorption amount, the specific surface area was calculated by the multi-point BET method.

After a pretreatment by heating and gas purging, a measurement was performed with nitrogen as an adsorbate, by a constant volume method under the condition of an adsorbate cross-sectional area of 0.162 $nm^2$. The pretreatment was specifically performed by conducting nitrogen purging for 20 minutes while heating at 65° C. a container in which particles are placed, leaving the resultant product to cool at room temperature, and thereafter conducting vacuum deaeration while heating the container at 65° C. until the pressure in the container reached 0.05 mmHg or less.

<Measurement of Relative Dielectric Constant Dk and Dielectric Loss Tangent Df when Polyimide Resin (A) was Used as Insulating Resin>

As a polyimide resin (A), there was used a polyimide KPI-MX300F (Kawamura Sangyo Co., Ltd., relative dielectric constant Dk=3.45, dielectric loss tangent Df=0.032, measured under conditions of measurement frequency of 5.8 GHz and measurement temperature of 23° C. by cavity resonance perturbation method). Particles to be measured were dispersed in ethyl acetate such that the particle concentration relative to the whole solid content (polyimide resin+particles) became 20% by weight. Using a planetary stirring deaerator (Mazerustar KK-250 manufactured by Kurabo Industries Ltd.), deaeration and stirring were performed to prepare a mixture for evaluation. The mixture for evaluation was applied on a glass plate having a thickness of 5 mm using an applicator in which the wet thickness was set to 250 μm, thereafter heated at 60° C. for 30 minutes, at 90° C. for 10 minutes, at 150° C. for 30 minutes, and at 200° C. for 30 minutes thereby to remove ethyl acetate, and then cooled to room temperature to obtain a film sample that contains particles. The relative dielectric constant and dielectric loss tangent of the obtained film were evaluated by a cavity resonance method (measurement frequency: 5.8 GHz).

<Measurement of Relative Dielectric Constant Dk when Polyimide Resin (B) was Used as Insulating Resin>

As a polyimide resin (B), there was used a super-high heat-resistant polyimide varnish (SPIXAREA HR002K manufactured by SOMAR Corporation, relative dielectric constant Dk=2.5, measured under conditions of measurement frequency of 5.8 GHz and measurement temperature of 23° C. by cavity resonance perturbation method). Particles to be measured were dispersed in N-methyl-2-pyrrolidone such that the particle concentration relative to the whole solid content (polyimide resin+particles) became 20% by weight. Using a planetary stirring deaerator (Mazerustar KK-250 manufactured by Kurabo Industries Ltd.), deaeration and stirring were performed to prepare a mixture for evaluation. The mixture for evaluation was applied on a glass plate having a thickness of 5 mm using an applicator in which the wet thickness was set to 250 μm, thereafter heated at 120° C. for 10 minutes, at 180° C. for 180 minutes, and at 270° C. for 60 minutes thereby to remove the solvent, and then cooled to room temperature to obtain a film sample that contains particles. The relative dielectric constant of the obtained film was evaluated by a cavity resonance method (measurement frequency: 5.8 GHz).

<SEM Observation>

An image of particles was taken by a scanning electron microscope (SEM) to obtain a surface SEM image. Furthermore, particles were embedded in epoxy resin and thereafter cut out into a thin film section. Then, the cross-sectional image of particles was taken by a scanning electron microscope (SEM) to obtain a cross-sectional SEM image.

Example 1

An oil phase was prepared by mixing 105 parts by weight of methyl methacrylate (MMA), 45 parts by weight of trimethylolpropane trimethacrylate (TMPTA), 0.3 part by weight of a "KAYAMER (registered trademark) PM-21" (manufactured by Nippon Kayaku Co., Ltd.) as a polymerizable monomer having an acidic phosphoric acid ester group, 0.75 part by weight of 2,2'-azobis(2,4-dimethylvaleronitrile) (trade name "ABNV" manufactured by Japan Finechem Company, Inc., 10-hour half-life temperature=51° C., activation energy ΔE=122.7 kJ/mol, frequency factor $A=1.80\times10^{18}\ hr^{-1}$) as a polymerization initiator, and 75 parts by weight of ethyl acetate and 75 parts by weight of cyclohexane as a non-polymerizable organic compound.

Also, an aqueous phase was prepared by mixing 900 parts by weight of deionized water as an aqueous medium and 23 parts by weight of magnesium pyrophosphate generated by a double decomposition method as a dispersant.

Next, the oil phase was dispersed in the aqueous phase using a TK-homomixer (manufactured by Primix Corporation) at 8,000 rpm for 5 minutes to obtain a dispersion liquid having a volume average particle diameter of about 8 μm. Thereafter, this dispersion liquid was put in a polymerization vessel equipped with a stirrer and a thermometer. The internal temperature of the polymerization vessel was increased to 55° C., and the suspension liquid was stirred for 5 hours. Thereafter, the internal temperature of the polymerization vessel was increased to 70° C. (secondary temperature increase), and the suspension liquid was stirred at 70° C. for 7 hours (decomposition rate of ABN-V=99.57%) to complete the suspension polymerization reaction.

After the suspension liquid was cooled, the dispersant (magnesium pyrophosphate) contained in this suspension liquid was decomposed by hydrochloric acid. Thereafter, the suspension liquid was dehydrated by filtration using a centrifugal filter to separate the solid content. The solid content was washed with sufficient ion exchanged water. Thereafter, the non-polymerizable organic compound was removed by performing vacuum drying at 70° C. for 24 hours to obtain spherical resin particles (1).

The resin particles (1) had a volume average particle diameter of 7.8 μm. In SEM observation, the inside of the resin particles (1) had a porous shape. The resin particles (1) had a bulk specific gravity of 0.33 g/cm$^3$.

The specific surface areas before and after the resin particles (1) were treated at a pressure of 0.4 MPa by a jet mill were measured to be 8.2 m$^2$/g and 23.2 m$^2$/g. The smaller difference in numerical values between the specific surface areas before and after jet milling indicates that particles have sufficient endurance strength against the impact by jet milling. This means that particles are not broken in response to an external force such as a shear force, pressure, or the like during production of a semiconductor member.

Also, the relative dielectric constant Dk and the dielectric loss tangent Df were measured.

The result is indicated in Table 1.

Figure 2:
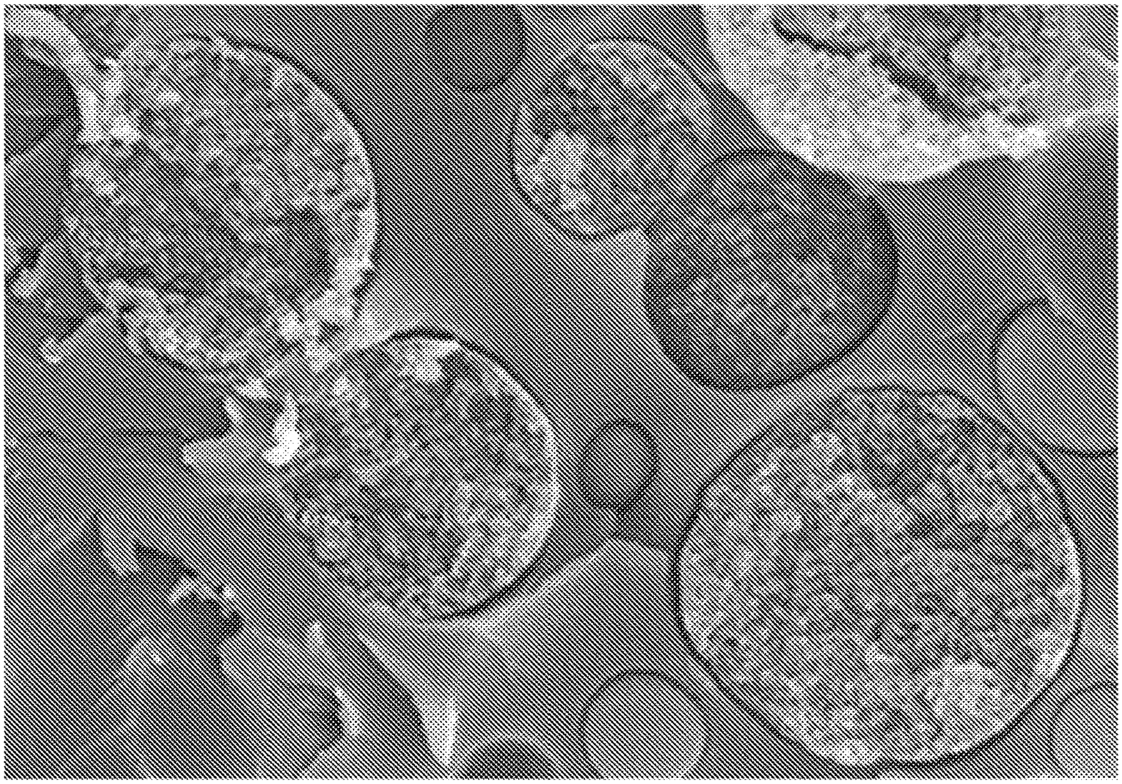
FIG. 2 is a cross-sectional SEM image of resin particles (1) obtained in Example 1.

The surface SEM image of the resin particles (1) is shown in FIG. 1. The cross-sectional SEM image of the resin particles (1) is shown in FIG. 2. It was observed that in the resin particles (1) produced with a (meth)acrylic acid alkyl ester and a multifunctional (meth)acrylic acid ester-based monomer, the surface of the particle was a dense shell without a hole, and the inside of the particle was a porous structure.

Example 2

Spherical resin particles (2) were obtained in the same manner as in Example 1, except that the oil phase was prepared by mixing 54 parts by weight of styrene (St), 36 parts by weight of ethylene glycol dimethacrylate (EGDMA), 0.3 part by weight of a "KAYAMER (registered trademark) PM-21" (manufactured by Nippon Kayaku Co., Ltd.) as a polymerizable monomer having an acidic phosphoric acid ester group, 0.75 part by weight of 2,2'-azobis (2,4-dimethylvaleronitrile) (trade name "ABN-V" manufactured by Japan Finechem Company, Inc., 10-hour half-life temperature=51° C., activation energy ΔE=122.7 kJ/mol, frequency factor A=1.80×10$^{18}$ hr$^{-1}$) as a polymerization initiator, and 105 parts by weight of ethyl acetate and 105 parts by weight of cyclohexane as a non-polymerizable organic compound.

The result is indicated in Table 1.

Example 3

Spherical resin particles (3) were obtained in the same manner as in Example 1, except that the oil phase was prepared by mixing 135 parts by weight of methyl methacrylate (MMA), 15 parts by weight of trimethylolpropane trimethacrylate (TMPTA), 0.3 part by weight of a "KAYAMER (registered trademark) PM-21" (manufactured by Nippon Kayaku Co., Ltd.) as a polymerizable monomer having an acidic phosphoric acid ester group, 0.75 part by weight of 2,2'-azobis(2,4-dimethylvaleronitrile) (trade name "ABN-V" manufactured by Japan Finechem Company, Inc., 10-hour half-life temperature=51° C., activation energy ΔE=122.7 kJ/mol, frequency factor A=1.80×10$^{18}$ hr$^{-1}$) as a polymerization initiator, and 75 parts by weight of ethyl acetate and 75 parts by weight of cyclohexane as a non-polymerizable organic compound.

The result is indicated in Table 1.

Example 4

Spherical resin particles (4) were obtained in the same manner as in Example 1, except that the oil phase was prepared by mixing 105 parts by weight of isobutyl methacrylate (IBMA), 45 parts by weight of trimethylolpropane trimethacrylate (TMPTA), 0.3 part by weight of a "KAYAMER (registered trademark) PM-21" (manufactured by Nippon Kayaku Co., Ltd.) as a polymerizable monomer having an acidic phosphoric acid ester group, 0.75 part by weight of 2,2'-azobis(2,4-dimethylvaleronitrile) (trade name "ABN-V" manufactured by Japan Finechem Company, Inc., 10-hour half-life temperature=51° C., activation energy ΔE=122.7 kJ/mol, frequency factor A=1.80×10$^{18}$ hr$^{-1}$) as a polymerization initiator, and 75 parts by weight of ethyl acetate and 75 parts by weight of cyclohexane as a non-polymerizable organic compound.

The result is indicated in Table 1.

Example 5

Spherical resin particles (5) were obtained in the same manner as in Example 1, except that the oil phase was prepared by mixing 105 parts by weight of styrene, 45 parts by weight of trimethylolpropane trimethacrylate (TMPTA), 0.8 part by weight of an "ADEKA REASOAP PP-70" (manufactured by ADEKA Corporation) as a polymerizable monomer having an acidic phosphoric acid ester group, 0.75 part by weight of 2,2'-azobis(2,4-dimethylvaleronitrile) (trade name "ABN-V" manufactured by Japan Finechem Company, Inc., 10-hour half-life temperature=51° C., activation energy ΔE=122.7 kJ/mol, frequency factor A=1.80×10$^{18}$ hr$^{-1}$) as a polymerization initiator, and 75 parts by weight of ethyl acetate and 75 parts by weight of cyclohexane as a non-polymerizable organic compound.

The result is indicated in Table 1.

Example 6

Spherical resin particles (6) were obtained in the same manner as in Example 1, except that 150 parts by weight of cyclohexane was used as a non-polymerizable organic compound. In SEM observation, the resin particles (6) were particles having only one hole inside the particle.

The result is indicated in Table 1.

Example 7

Spherical resin particles (7) were obtained in the same manner as in Example 1, except that the rotational speed of the TK-homomixer in dispersing the prepared oil phase in the aqueous phase in Example 1 was changed to 2,500 rpm, and a dispersion liquid of about 35 μm was obtained.

The result is indicated in Table 1.

Example 8

An oil phase was prepared by mixing 65 parts by weight of methyl methacrylate (MMA), 85 parts by weight of ethylene glycol dimethacrylate (EGDMA), 0.3 part by weight of a "KAYAMER (registered trademark) PM-21" (manufactured by Nippon Kayaku Co., Ltd.) as a polymerizable monomer having an acidic phosphoric acid ester group, 0.75 part by weight of 2,2'-azobis(2,4-dimethylvaleronitrile) (trade name "ABN-V" manufactured by Japan Finechem Company, Inc., 10-hour half-life temperature=51° C., activation energy ΔE=122.7 kJ/mol, frequency factor $A=1.80\times10^{18}\ hr^{-1}$) as a polymerization initiator, and 75 parts by weight of ethyl acetate and 75 parts by weight of cyclohexane as a non-polymerizable organic compound. Also, an aqueous phase was prepared by mixing 900 parts by weight of deionized water as an aqueous medium and 90 parts by weight of tricalcium phosphate as a dispersant.

Spherical resin particles (8) were obtained otherwise in the same manner as in Example 1.

The resin particles (8) had a volume average particle diameter of 8.0 μm. In SEM observation, the inside of the resin particles (8) had a porous shape. The resin particles (8) had a bulk specific gravity of 0.32 g/cm$^3$.

The specific surface areas before and after the resin particles (8) were treated at, a pressure of 0.4 MPa by a jet mill were measured to be 7.2 m$^2$/g and 10.2 m$^2$/g.

Also, the relative dielectric constant Dk and the dielectric loss tangent Df were measured.

The result is indicated in Table 1.

Example 9

An oil phase was prepared by mixing 63 parts by weight of styrene (St), 102 parts by weight of a divinylbenzene (DVB) 810 (manufactured by Nippon Steel Chemical & Material Co., Ltd., 81% contained product, 19% of ethylvinylbenzene (EVB)), 15 parts by weight of HS Crysta 4100 (side-chain crystalline polyolefin manufactured by Hokoku Corporation), 0.3 part by weight of a "KAYAMER (registered trademark) PM-21" (manufactured by Nippon Kayaku Co., Ltd.) as a polymerizable monomer having an acidic phosphoric acid ester group, 1.5 parts by weight of an LPO (trade name "PEROYL L" manufactured by NOF Corporation, 10-hour half-life temperature=61.6° C., activation energy of =126.5 kJ/mol, frequency factor $A=3.81\times10^{18}\ hr^{-1}$) as an oil-soluble polymerization initiator, and 120 parts by weight of heptane as a non-polymerizable organic compound. Also, an aqueous phase was prepared by mixing 900 parts by weight of deionized water as an aqueous medium and 23 parts by weight of magnesium pyrophosphate generated by a double decomposition method as a dispersant.

Next, the oil phase was dispersed in the aqueous phase using a TK-homomixer (manufactured by Primix Corporation) at 8,000 rpm for 5 minutes to obtain a dispersion liquid having a volume average particle diameter of about 8.0 μm. Thereafter, this dispersion liquid was put in a polymerization vessel equipped with a stirrer and a thermometer. The internal temperature of the polymerization vessel was increased to 55° C., and the suspension liquid was stirred for 5 hours. Thereafter, the internal temperature of the polymerization vessel was increased to 70° C. (secondary temperature increase), and the suspension liquid was stirred at 80° C. for 8 hours (decomposition rate of PEROYL L=99.73%) to complete the suspension polymerization reaction.

The suspension liquid was cooled and thereafter dehydrated by filtration using a centrifugal filter to separate the solid content. The solid content was washed with sufficient ion exchanged water. Thereafter, the non-polymerizable organic compound was removed by performing vacuum drying at 70° C. for 24 hours to obtain spherical resin particles (9).

The resin particles (9) had a volume average particle diameter of 8.0 μm. In SEM observation, the inside of the resin particles (9) had a porous shape. The resin particles (9) had a bulk specific gravity of 0.07 g/cm$^3$.

The specific surface areas before and after the resin particles (9) were treated at a pressure of 0.4 MPa by a jet mill were measured to be 15.6 m$^2$/g and 21.3 m$^2$/g.

Also, the relative dielectric constant Dk and the dielectric loss tangent Df were measured. The result is indicated in Table 1.

Figure 3:
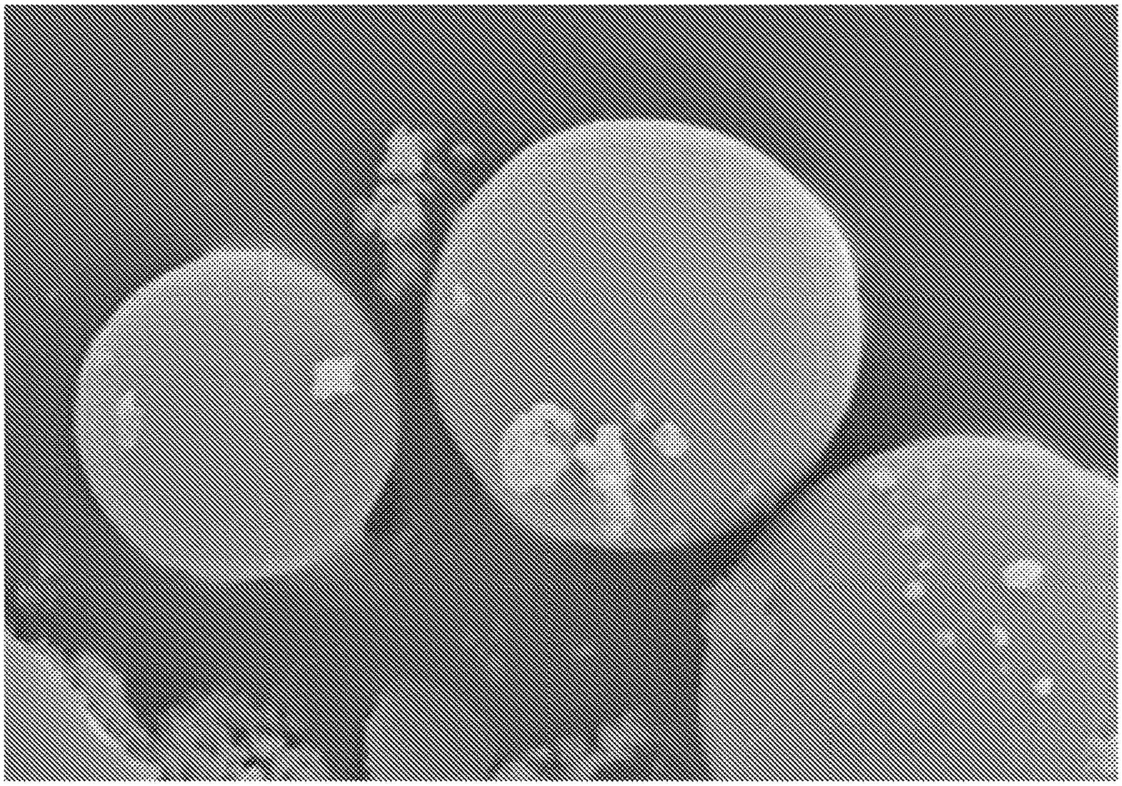
FIG. 3 is a surface SEM image of resin particles (9) obtained in Example 9.
Figure 4:
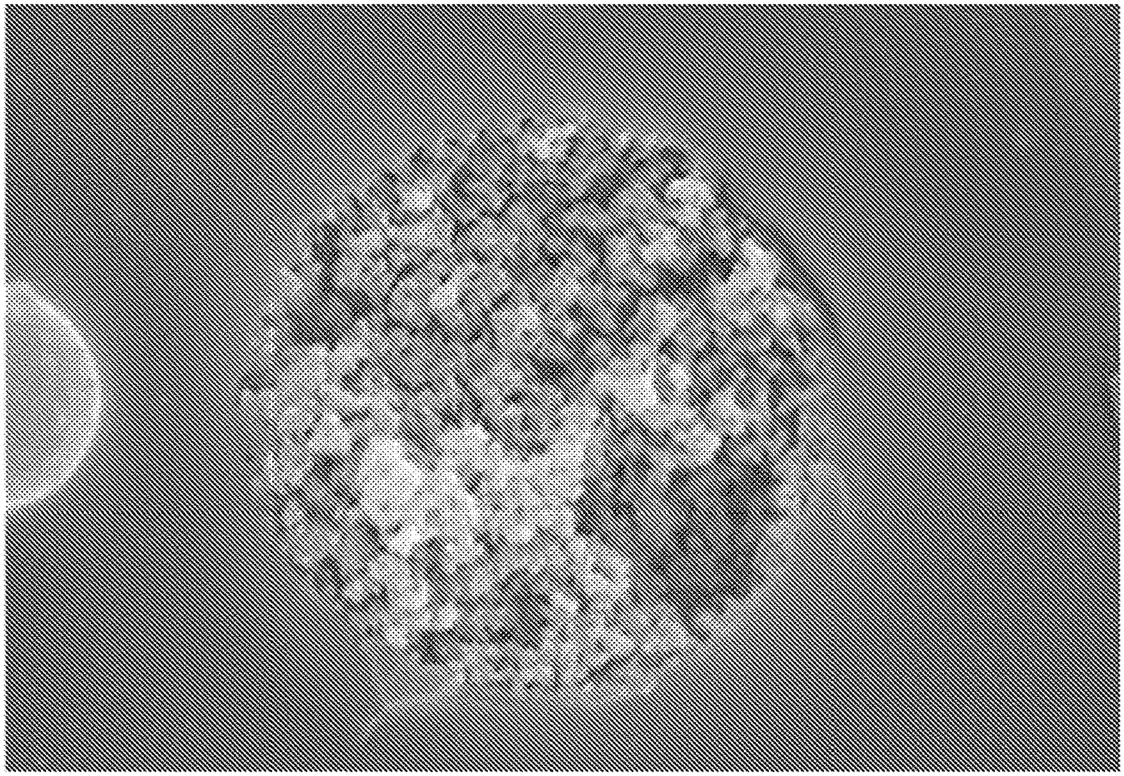
FIG. 4 is a cross-sectional SEM image of resin particles (9) obtained in Example 9.

The surface SEM image of the resin particles (9) is shown in FIG. 3. The cross-sectional SEM image of the resin particles (9) is shown in FIG. 4. It was observed that in the resin particles (9) produced with a styrene-based monomer and an aromatic divinyl-based monomer, the surface of the particle was a dense shell without a hole, and the inside of the particle was a porous structure.

Example 101

An oil phase was prepared by mixing 105 parts by weight of styrene (St), 45 parts by weight of a divinylbenzene (DVB) 810 (manufactured by Nippon Steel Chemical & Material Co., Ltd., 81% contained product, 19% of ethylvinylbenzene (EVB)), 1.5 parts by weight of 2,2'-azobis(2,4-dimethylvaleronitrile) (trade name "ABN-V" manufactured by Japan Finechem Company, Inc., 10-hour half-life temperature=51° C., activation energy ΔE=122.7 kJ/mol, frequency factor $A=1.80\times10^{18}\ hr^{-1}$) as an oil-soluble polymerization initiator, and 150 parts by weight of cyclohexane as a non-polymerizable organic compound. Also, an aqueous phase was prepared by mixing 900 parts by weight of deionized water as an aqueous medium, 1 part by weight of sodium lauryl sulfate as a dispersant, and 2.3 parts by weight of 2,2'-azobis[N-(2-carboxyethyl)-2-methylpropionamidine] tetrahydrate (trade name "VA-057" manufactured by FUJIFILM Wako Pure Chemical Corporation), 10-hour half-life temperature=57° C., activation energy ΔE=122.7 kJ/mol, frequency factor $A=1.80\times10^{18}\ hr^{-1}$) as a water-soluble polymerization initiator.

Next, the oil phase was dispersed in the aqueous phase using a TK-homomixer (manufactured by Primix Corporation) at 8,000 rpm for 5 minutes to obtain a dispersion liquid of about 8 μm. Thereafter, this dispersion liquid was put in a polymerization vessel equipped with a stirrer and a thermometer. The internal temperature of the polymerization vessel was increased to 60° C., and the suspension liquid was stirred for 5 hours. Thereafter, the internal temperature of the polymerization vessel was increased to 70° C. (secondary temperature increase), and the suspension liquid was stirred at 70° C. for 16 hours (decomposition rate of VA-057=99.76%) to complete the suspension polymerization reaction. A sufficient reaction time of divinylbenzene was ensured to obtain high strength.

The suspension liquid was cooled and thereafter dehydrated by filtration using a centrifugal filter to separate the solid content. The solid content was washed with sufficient distilled water. Thereafter, the non-polymerizable organic compound was removed by performing vacuum drying at 70° C. for 24 hours to obtain spherical resin particles (10).

The resin particles (10) had a volume average particle diameter of 8.1 μm. In SEM observation, the inside of the resin particles (10) had a porous shape. The resin particles (10) had a bulk specific gravity of 0.30 g/cm$^3$.

The specific surface areas before and after the resin particles (10) were treated at a pressure of 0.4 MPa by a jet mill were measured to be 1.9 $m^2/g$ and 28.3 $m^2/g$.

Also, the relative dielectric constant Dk and the dielectric loss tangent Df were measured.

The result is indicated in Table 1.

Example 11

An oil phase was prepared by mixing 63 parts by weight of styrene (St), 102 parts by weight of a divinylbenzene (DVB) 810 (manufactured by Nippon Steel Chemical & Material Co., Ltd., 81% contained product, 19% of ethylvinylbenzene (EVB)), 15 parts by weight of HS Crysta 4100 (side-chain crystalline polyolefin manufactured by Hokoku Corporation), 1.65 parts by weight of an LPO (trade name "PEROYL L" manufactured by NOF Corporation, 10-hour half-life temperature=61.6° C., activation energy ΔE=126.5 kJ/mol, frequency factor $A=3.81\times10^{18}$ $hr^{-1}$) as an oil-soluble polymerization initiator, and 120 parts by weight of heptane as a non-polymerizable organic compound. Also, an aqueous phase was prepared by mixing 900 parts by weight of deionized water as an aqueous medium and 23 parts by weight of magnesium pyrophosphate generated by a double decomposition method as a dispersant.

Next, the oil phase was dispersed in the aqueous phase using a TK-homomixer (manufactured by Primix Corporation) at 9,000 rpm for 10 minutes. Thereafter, the dispersion liquid was processed through a microfluidizer (HC-5000 manufactured by Mizuho Industrial Co., Ltd.) under a pressure of 100 $kg/cm^2$ once to obtain a dispersion liquid of about 4 μm. Thereafter, this dispersion liquid was put in a polymerization vessel equipped with a stirrer and a thermometer. The internal temperature of the polymerization vessel was increased to 70° C., and the suspension liquid was stirred for 10 hours. Thereafter, the internal temperature of the polymerization vessel was increased to 80° C. (secondary temperature increase), and the suspension liquid was stirred at 80° C. for 8 hours (decomposition rate of PEROYL L=99.73%) to complete the suspension polymerization reaction.

The suspension liquid was cooled and thereafter dehydrated by filtration using a centrifugal filter to separate the solid content. The solid content was washed with sufficient ion exchanged water. Thereafter, the non-polymerizable organic compound was removed by performing vacuum drying at 70° C. for 24 hours to obtain spherical resin particles (11).

The resin particles (11) had a volume average particle diameter of 3.5 μm. In SEM observation, the inside of the resin particles (11) had a porous shape. The resin particles (11) had a bulk specific gravity of 0.2 g/ml.

The specific surface areas before and after the resin particles (11) were treated at a pressure of 0.4 MPa by a jet mill were measured to be 3.8 $m^2/g$ and 20 $m^2/g$.

Also, the relative dielectric constant Dk and the dielectric loss tangent Df were measured.

The result is indicated in Table 1.

Example 12

An oil phase was prepared by mixing 63 parts by weight of styrene (St), 102 parts by weight of a divinylbenzene (DVB) 810 (manufactured by Nippon Steel Chemical & Material Co., Ltd., 81% contained product, 19% of ethylvinylbenzene (EVB)), 15 parts by weight of HS Crysta 4100 (side-chain crystalline polyolefin manufactured by Hokoku Corporation), 1.65 parts by weight of an LPO (trade name "PEROYL L" manufactured by NOF Corporation, 10-hour half-life temperature=61.6° C., activation energy ΔE=126.5 kJ/mol, frequency factor $A=3.81\times10^{18}$ $hr^{-1}$) as an oil-soluble polymerization initiator, and 120 parts by weight of cyclohexane as a non-polymerizable organic compound. Also, an aqueous phase was prepared by mixing 900 parts by weight of deionized water as an aqueous medium and 1 part by weight of sodium lauryl sulfate as a surfactant.

Next, the oil phase was preliminarily dispersed in the aqueous phase using a "CLEARMIX" (manufactured by M Technique Co., Ltd.) at 8,000 rpm for 5 minutes and thereafter dispersed at 18,000 rpm for 10 minutes to obtain a dispersion liquid of about 1 Thereafter, this dispersion liquid was put in a polymerization vessel equipped with a stirrer and a thermometer. The internal temperature of the polymerization vessel was increased to 70° C., and the suspension liquid was stirred for 10 hours. Thereafter, the internal temperature of the polymerization vessel was increased to 80° C. (secondary temperature increase), and the suspension liquid was stirred at 80° C. for 8 hours (decomposition rate of PEROYL L=99.73%) to complete the suspension polymerization reaction.

The suspension liquid was cooled and thereafter dehydrated by filtration using a centrifugal filter to separate the solid content. The solid content was washed with sufficient ion exchanged water. Thereafter, the non-polymerizable organic compound was removed by performing vacuum drying at 70° C. for 24 hours to obtain spherical resin particles (12).

The resin particles (12) had a volume average particle diameter of 1.2 μm. In SEM observation, the inside of the resin particles (12) had a porous shape. The resin particles (12) had a bulk specific gravity of 0.3 g/ml.

The specific surface areas before and after the resin particles (12) were treated at a pressure of 0.4 MPa by a jet mill were measured to be 5.6 $m^2/g$ and 12.4 $m^2/g$.

Also, the relative dielectric constant Dk and the dielectric loss tangent Df were measured.

The result is indicated in Table 1.

TABLE 1

| | | Example 1 | Example 2 | Example 3 | Example 4 | Example 6 | Example 6 |
|---|---|---|---|---|---|---|---|
| Components of resin particles | MMA | 105 | — | 135 | — | — | 105 |
| | St | — | 54 | — | — | 105 | — |
| | IBMA | — | — | — | 105 | — | — |
| | EGDMA | — | 36 | — | — | — | — |
| | TMPTA | 48 | — | 16 | 48 | 46 | 46 |
| | DVB 810<br>DVB: 81%<br>EVB: 19% | — | — | — | — | — | — |
| | PM- 21 | 0.3 | 0.3 | 0.3 | 0.3 | — | 0.3 |
| | PP 70 | — | — | — | — | 0.8 | — |

TABLE 1-continued

| | | | | | | | |
|---|---|---|---|---|---|---|---|
| | HS 4100 | | | | | | |
| Polymerization initiator | ABN-V | 0.75 | 0.75 | 0.75 | 0.75 | 0.75 | 0.75 |
| | VA-057 | — | — | — | — | — | — |
| | LPO | — | — | — | — | — | — |
| Non-polymerizalde organic compound | Ethyl acetate | 75 | 105 | 75 | 75 | 75 | — |
| | Cyclohexane | 75 | 105 | 75 | 75 | 75 | 150 |
| | Heptane | — | — | — | — | — | — |
| Dispersant | | Mg pyrophosphate | Mg pyrophosphate | Mg pyrophosphate | Mg pyrophosphate | Mg pyrophosphate | Mg pyrophosphate |
| Volume average particle diameter [μm] | | 7.8 | 7.6 | 8.2 | 7.6 | 6.5 | 8.4 |
| Particle structure | | Porque inside | Porous inside | Porous inside | Porous mside | Porous inside | Single hollow |
| Bulk specific gravity [g/cm$^3$] | | 0.33 | 0.30 | 0.38 | 0.33 | 0.29 | 0.30 |
| Specific surface area [m$^2$/g] | | 8.2 | 3.6 | 3.5 | 5.4 | 1.9 | 1.1 |
| Specific surface area after jet milling [m$^2$/g] | | 23.2 | 8.5 | 24.0 | 10.3 | 5.4 | 1.7 |
| Decreasing rate of relative dielectric constant Dk of polyimide resin (A) | Resin single film | 3.45 | 3.45 | 3.45 | 3.45 | 3.45 | 3.45 |
| | Particle composite film | 2.66 | 2.62 | 2.54 | 2.64 | 2.60 | 2.73 |
| | Decreasing rate [%] | 22.8 | 24.1 | 26.3 | 23.5 | 24.7 | 20.7 |
| Decreasing rate of dielectric loss tangent Df of polyimide resin (A) | Resin single film | 0.0321 | 0.0321 | 0.0321 | 0.0321 | 0.0321 | 0.0321 |
| | Particle composite film | 0.0275 | 0.0273 | 0.0268 | 0.0274 | 0.0271 | 0.0279 |
| | Decreasing rate [%] | 14.2 | 15.1 | 16.5 | 14.7 | 15.5 | 13.0 |
| Decreasing rate of relative dielectric constant. Dk of polyimide resin (B) | Resin single film | 2.50 | 2.50 | 2.50 | 2.50 | 2.50 | 2.50 |
| | Particle composite film | 2.17 | 2.15 | 2.12 | 2.16 | 2.14 | 2.20 |
| | Decreasing rate [%] | 13.2 | 14.0 | 15.2 | 13.6 | 14.3 | 12.0 |

| | | Example 7 | Example 8 | Example 9 | Example 10 | Example 11 | Example 12 |
|---|---|---|---|---|---|---|---|
| Components of resin particles | MMA | 105 | 65 | — | — | — | — |
| | St | — | — | 63 | 105 | 63 | 63 |
| | IBMA | — | — | — | — | — | — |
| | EGDMA | — | 85 | — | — | — | — |
| | TMPTA | 45 | — | — | — | — | — |
| | DVB 810 DVB: 81% EVB: 19% | — | — | 102 | 45 | 102 | 102 |
| | PM- 21 | 0.3 | 0.3 | 0.3 | — | — | — |
| | PP 70 | — | — | — | — | — | — |
| | HS 4100 | — | — | 15 | — | 15 | 15 |
| Polymerization initiator | ABN-V | 0.75 | 0.75 | — | — | — | — |
| | VA-057 | — | — | — | 2.3 | — | — |
| | LPO | — | — | 1.65 | — | 1.65 | 1.65 |
| Non-polymerizalde organic compound | Ethyl acetate | 75 | 75 | — | — | — | — |
| | Cyclohexane | 75 | 75 | — | 150 | — | 120 |
| | Heptane | — | — | 120 | — | 120 | — |
| Dispersant | | Mg pyrophosphate | Tri Ca pyrophosphate | Mg pyrophosphate | Na lauryl sulfate | Mg pyrophosphate | Na lauryl sulfate |
| Volume average particle diameter [μm] | | 35.0 | 8.0 | 8.0 | 8.1 | 3.5 | 1.2 |
| Particle structure | | Porous inside | Porous inside | Porous inside | Porous inside | Porous inaide | Porous inside |
| Bulk specific gravity [g/cm$^3$] | | 0.35 | 0.32 | 0.07 | 0.30 | 0.2 | 0.3 |
| Specific surface area [m$^2$/g] | | 10.3 | 7.2 | 15.6 | 1.9 | 3.8 | 5.6 |
| Specific surface area after jet milling [m$^2$/g] | | 20.5 | 10.2 | 21.8 | 28.3 | 20.0 | 12.4 |
| Decreasing rate of relative dielectric constant Dk of polyimide resin (A) | Resin single film | 3.45 | 3.45 | 3.45 | 3.45 | 3.45 | 3.45 |
| | Particle composite film | 2.63 | 2.65 | 2.57 | 2.55 | 2.55 | 2.58 |
| | Decreasing rate [%] | 23.8 | 23.1 | 25.6 | 26.2 | 26.2 | 25.2 |
| Decreasing rate of dielectric loss tangent Df of polyimide resin (A) | Resin single film | 0.0321 | 0.0321 | 0.0321 | 0.0321 | 0.0321 | 0.0321 |
| | Particle composite film | 0.0278 | 0.0274 | 0.0250 | 0.0247 | 0.0247 | 0.0251 |
| | Decreasing rate [%] | 14.9 | 14.5 | 22.0 | 23.2 | 23.2 | 21.8 |
| Decreasing rate of relative dielectric | Resin single film | 2.50 | 2.50 | 2.50 | 2.50 | 2.50 | 2.50 |
| | Particle | 2.16 | 2.17 | 2.19 | 2.15 | 2.15 | 2.16 |

TABLE 1-continued

| | | | | | | | |
|---|---|---|---|---|---|---|---|
| constant. Dk of polyimide resin (B) | composite film Decreasing rate [%] | 13.8 | 13.4 | 12.6 | 14.0 | 14.0 | 13.6 |

As shown in Examples 1 to 12, it was found that the hollow resin particles used in a resin composition for semiconductor members according to an embodiment of the present invention can exert excellent low dielectric properties. Therefore, the hollow resin particles used in a resin composition for semiconductor members according to an embodiment of the present invention can exert excellent low dielectric properties and provide a highly reliable semiconductor member.

INDUSTRIAL APPLICABILITY

The hollow resin particles used in a resin composition for semiconductor members according to an embodiment of the present invention are used in a resin composition for semiconductor members and thus can be suitably used in semiconductor members such as a semiconductor package and a semiconductor module.

The invention claimed is:

1. Hollow resin particles used in a resin composition for semiconductor members, having a hole part inside the particle, wherein a decreasing rate of a relative dielectric constant Dk1 of a film (F1) formulated with 80 parts by weight of polyimide and 20 parts by weight of the hollow resin particles to a relative dielectric constant Dk0 of a film (F0) formed with only the polyimide is 3% or more, and wherein a bulk specific gravity of the hollow resin particles is 0.01 g/cm$^3$ to 0.6 g/cm$^3$.

2. The hollow resin particles used in a resin composition for semiconductor members according to claim 1, wherein a decreasing rate of a dielectric loss tangent Df1 of the film (F1) to a dielectric loss tangent Df0 of the film (F0) is 3% or more.

3. The hollow resin particles used in a resin composition for semiconductor members according to claim 1, wherein the hollow resin particles have a volume average particle diameter of 0.5 μm to 100 μm.

4. The hollow resin particles used in a resin composition for semiconductor members according to claim 1, wherein the hollow resin particles include a polymer (P) that contains at least one selected from the group consisting of a vinyl-based monomer-derived structural unit (I) and a phosphoric acid ester-based monomer-derived structural unit (II).

5. The hollow resin particles used in a resin composition for semiconductor members according to claim 4, wherein the phosphoric acid ester-based monomer-derived structural unit (II) has an ethylene-based unsaturated group.

6. The hollow resin particles used in a resin composition for semiconductor members according to claim 4, wherein the phosphoric acid ester-based monomer is represented by formula (1):

$$[R^1-O-(R^2-O)_m-(\overset{O}{\overset{\|}{C}}-(CH_2)_vO)_n]_x\overset{O}{\overset{\|}{P}}-(OH)_{3-x}, \quad (1)$$

wherein in formula (1), $R^1$ is a (meth)acryl group or an allyl group, $R^2$ is a linear or branched alkylene group, m is an integer of 1 to 30, n is 0 or 1, v is an integer of 1 to 10, and x is 1 or 2.

7. The hollow resin particles used in a resin composition for semiconductor members according to claim 1, wherein a specific surface area is 1 m$^2$/g to 30 m$^2$/g.

8. The hollow resin particles used in a resin composition for semiconductor members according to claim 1, wherein the hole part inside the particle has a porous structure.

9. The hollow resin particles used in a resin composition for semiconductor members according to claim 1, wherein the hole part inside the particle has a single hollow structure.

10. A semiconductor member comprising the hollow resin particles used in a resin composition for semiconductor members according to claim 1.

* * * * *